US012652012B2

(12) United States Patent
Foley

(10) Patent No.: US 12,652,012 B2
(45) Date of Patent: Jun. 9, 2026

(54) HYBRID DISTRIBUTED DRIVER

(71) Applicant: MACOM Technology Solution Holdings, Inc., Lowell, MA (US)

(72) Inventor: David Foley, Sophia Antipolis Cedex (FR)

(73) Assignee: MACOM Technology Solution Holdings, Inc., Lowell, MA (US)

( * ) Notice: Subject to any disclaimer, the term of this patent is extended or adjusted under 35 U.S.C. 154(b) by 534 days.

(21) Appl. No.: 17/855,807

(22) Filed: Jul. 1, 2022

(65) Prior Publication Data

US 2024/0007069 A1 Jan. 4, 2024

(51) Int. Cl.
*H03F 3/60* (2006.01)
*H03F 3/45* (2006.01)

(52) U.S. Cl.
CPC ......... *H03F 3/607* (2013.01); *H03F 3/45183* (2013.01); *H03F 3/45475* (2013.01)

(58) Field of Classification Search
CPC .. H03F 3/607; H03F 3/45183; H03F 3/45475; H03F 3/45; H03F 3/605; H03F 3/45179
USPC .......................................................... 330/54
See application file for complete search history.

(56) References Cited

U.S. PATENT DOCUMENTS

| | | |
|---|---|---|
| 4,885,550 A | 12/1989 | Ferrer |
| 5,055,795 A | 10/1991 | Kasper et al. |
| 5,798,664 A | 8/1998 | Nagahori |
| 5,920,230 A | 7/1999 | Beall |

| | | |
|---|---|---|
| 6,046,642 A | 4/2000 | Brayton |
| 6,140,872 A | 10/2000 | McEldowney |
| 6,593,810 B2 | 7/2003 | Yoon |
| 6,737,924 B1 | 5/2004 | Paillet et al. |
| 7,978,007 B2 | 7/2011 | Tiiliharju |
| 8,203,384 B1 | 6/2012 | Thiagarajan et al. |

(Continued)

FOREIGN PATENT DOCUMENTS

KR       101690431000       12/1926

OTHER PUBLICATIONS

Duvada, K., Saxena, V., and Baker, R.J., "High Speed Digital Input Buffer Circuits" (Year: 2006).*

(Continued)

*Primary Examiner* — Andrea Lindgren Baltzell
*Assistant Examiner* — Nareh Shamiryan
(74) *Attorney, Agent, or Firm* — Jason H. Vick; Amped IP LLC

(57) ABSTRACT

A distributed driver for an optic signal generator comprising amplifier cells having an amplifier cell input configured to receive the input signal and amplifiers configured to amplify the received signal to create an amplified signal, and an amplifier cell output. The distributed driver also includes an input path connected to the amplifier cell input to receive the input signal and distribute the input signal to the two or more amplifier cells. The input path includes one or more buffers configured to introduce a delay into the input signal. An output path is provided and connects to the amplifier cell outputs of the two or more amplifier cells. The output path is configured to receive the amplified signal and the output path includes one or more inductors that incorporated with the parasitic capacitance from the two or more amplifier cells form the LC segments of an artificial transmission line.

17 Claims, 8 Drawing Sheets

(56)                    References Cited

U.S. PATENT DOCUMENTS

|             |     |         |                  |           |
| ----------- | --- | ------- | ---------------- | --------- |
| 8,704,592   | B2  | 4/2014  | Tatsumi          |           |
| 8,742,845   | B2  | 6/2014  | Dusad            |           |
| 8,754,711   | B2  | 6/2014  | Welch            |           |
| 9,641,136   | B2  | 5/2017  | Tatsumi          |           |
| 10,263,573  | B2  | 4/2019  | Bazzani et al.   |           |
| 11,515,841  | B2  | 11/2022 | Kennan           |           |
| 2002/0113656 | A1 | 8/2002  | Iwai             |           |
| 2002/0153949 | A1 | 10/2002 | Yoon             |           |
| 2003/0201830 | A1 | 10/2003 | Stengel et al.   |           |
| 2005/0280467 | A1 | 12/2005 | Shi et al.       |           |
| 2008/0012640 | A1 | 1/2008  | Campbell         |           |
| 2009/0108935 | A1 | 4/2009  | Kuo et al.       |           |
| 2011/0316632 | A1 | 12/2011 | Takemoto         |           |
| 2012/0235744 | A1 | 9/2012  | Albertini        |           |
| 2012/0262235 | A1 | 10/2012 | Hoogzaad         |           |
| 2013/0043877 | A1 | 2/2013  | Tang             |           |
| 2014/0327483 | A1 | 11/2014 | Balteanu         |           |
| 2016/0254793 | A1 | 9/2016  | Su et al.        |           |
| 2016/0380699 | A1* | 12/2016 | Tatsumi ................ | H03F 3/605 |
|             |     |         |                  | 330/286   |
| 2018/0062589 | A1 | 3/2018  | Bazzani et al.   |           |

OTHER PUBLICATIONS

International Search Report for International Application No. PCT/US2023/021076, mailed Aug. 29, 2023.

Written Opinion for International Application No. PCT/US2023/021076, mailed Aug. 29, 2023.

International Preliminary Report on Patentability for International Application No. PCT/US2023/021076, mailed Jan. 16, 2025.

\* cited by examiner

HYBRID DISTRIBUTED DRIVER

1. FIELD OF THE INVENTION

The invention relates to distributed drivers and in particular to a hybrid type distributed driver.

2. RELATED ART

Signal drivers may be used in numerous different type of systems such as but not limited to wireline communication systems, wireless communication systems, and optic system, such as systems that utilize fiber optic cable as a signal medium. In numerous different environments of use, a signal must be driven or amplified as part of the transmit process.

A distributed driver architecture is chosen to address bandwidth and return-loss limitations of an equivalent traditional lumped driver approach. A block diagram illustrating the differences between the lumped and distributed driver is shown in FIG. 1. The bandwidth of the lumped driver, comprising a single stage, is dictated by the termination resistance and the loading capacitance from the lumped stages. The lumped stage, and hence loading capacitance, can be quite large because of the large current required in the stage. The large current dictates the use of e.g. large MOSFET devices in the stage for a CMOS process. This large capacitance, from the driver stage devices and the associated routing parasitics, can be very restrictive and the benefit of moving to a distributed approach is that the parasitic loading is now reduced by the chosen number of stages. An example 4-stage distributed driver architecture is shown in FIGS. 1 and 2, which are described below. The number of stages is chosen to meet bandwidth, power, and complexity concerns. For this example, each of the four distributed stages would carry a quarter of the load current in the equivalent lumped stage.

The distributed driver incorporates artificial input and output inductor-capacitor (LC) transmission lines. The transmission line L and C components are chosen to meet both impedance and delay requirements, thereby minimizing reflections from impedance mismatch, and ensuring in-phase addition of the distributed output stages. The impedance requirement is defined in equation (1) and the delay is defined in equation (2). The L and C product, shown in equation (3), must also be chosen small enough so that the line approximates ideal behavior over the desired bandwidth [2].

$$Z=(L/C)^{1/2} \tag{1}$$

$$Tau=(L*C)^{1/2} \tag{2}$$

$$Cutoff\ Frequency=1/(\pi*(L*C)^{1/2}) \tag{3}$$

FIG. 1 illustrates a block diagram of an exemplary prior art distributed amplifier. A singled ended arrangement is shown. The laser driver 104 includes an input node 108 and an output node 112. The input node 108 receives an outgoing electrical signal to be transmit as an optic signal. In one embodiment, the input node receives data for high-speed transmission over the optic fiber. The output node 112 connects to a conductor, such as a trace that provides the output signal to an optic signal generator. The path between the output node 112 and the optic signal generator may be defined as a transmission line.

Connected to the input node 108 is a first gain stage 120A and a first stage inductor 124. A capacitance, shown as capacitor 132, 136, associated with each amplifier cell 120A is parasitic and is part of the first gain stage, and thus not a separate element. This arrangement repeats through one or more additional gain stages 120B, 120C, 120D as shown. Four exemplary gain stages are shown in FIG. 1, but in other embodiments a great or lesser number of gain stages may be implemented subject to the target bandwidth and/or impedance of the transmission line.

As shown in FIG. 1, the input of a first gain cell 120A is connected to the input of a second gain cell 120B through a first inductor 124A or a transmission line, the input of the second gain cell 120B is connected to the input of a third gain cell 120C through a second inductor 124B or a transmission line and so on through the fourth gain cell 120D and inductor 123C. The inductors may be actual elements, or inductance that is part of or built into the conductive path. The output of the last gain cell 120D is connected to a termination element 150 directly or through an inductor/transmission line 124D as shown. The termination element 150 can be a resistor or any other more complicated structure that is typically known in the field.

The input node 108 of the first gain cell 120A is connected to the output of a pre-driver directly (as shown) or through an inductor/transmission line. The output of the first gain cell 120A is connected to the output of the second gain cell 120B through another inductor 148A or a transmission line, the output of the second gain cell 120B is connected to the output of the third gain cell 120C through another inductor 148B or a transmission line. The output of the third gain cell 120C is connected to the output of the fourth gain cell 120D through another inductor 148C or a transmission line. The output of the last gain cell 120D is connected to output node 112 directly (as shown) or through an inductor/transmission line. The output node 112 connects to the optic signal generator, such as a laser. In other embodiments, a greater or fewer number of amplifier (gain) cell may be implemented.

The output of the first gain cell 120A is connected to a termination element 140 directly (as shown) or through an inductor/transmission line. Termination resistors 140, 150 are associated with the first gain cell (amplifier stage) 120A and the last gain cell (amplifier stage) 120D. In other embodiments, additional resistor may be placed in the driver circuit. The resistors 140, 150 may be selected based on various design constraints and preferences such as power consumption, maximum operating frequency, input and output impedance, and the load. The resistance typically ranges from 20 ohms to 100 ohms but are driven and determined by system requirements. The signal propagates through the gain cells 120A, 120B, 120C, 120D towards the output node 112.

FIG. 2 illustrates an example embodiment of a distributed driver arranged in a differential pair configuration. In relation to FIG. 1, similar elements are labeled with identical reference numbers. Elements previously described are not described again. In this embodiment, the distributed amplifiers are configured as a differential pair. A pair of FET device 370, 372 are arranged as shown with a current source 380 or path located below the FET device 370. Operation of this circuit configuration is known in the art and not described herein. Parasitic capacitance 332, 336 is also shown. More than one differential pair may be provided in each cell 320. Additional differential pairs 380B, 380C, 380D are also provided as shown in blocks.

Additional inductors 324A, 324B, 324C, 324D are provided and associated with the second leg of the differential pair along the input path at the bottom of FIG. 2. Additional inductors 348A, 348B, and 348C are provided and associated with the second leg of the differential pair along the output path at the top of FIG. 2. Similarly, termination resistors 340, 350 are arranged as shown in the second leg of the differential pair. Resistor 340 is the termination resistor of the output, while resistor 350 is the termination resistor of the input. Operation and function is generally similar to the embodiment shown in FIG. 1, with the differential signal provided on input nodes 108 and 308. Output nodes 112 and 312 provide a differential signal to an optic signal driver.

These prior art designs suffered from several drawbacks. One drawback is the size of the circuit. The resulting circuit created parasitic capacitances issues and loading causing it to be too slow.

SUMMARY

A distributed driver architecture derives its major advantage from the output line where the loading capacitance is much larger, and the driver output impedance requirement can be restricted to values such as 25Ω and 50Ω. The input line loading capacitance is usually much less, and the input-line impedance may not be restricted to a particular value. Taking this into consideration and to overcome the drawbacks of the prior art and provide additional benefits, a distributed driver for an optic signal generator is disclosed. In one embodiment, the distributed driver comprises two or more amplifier cells having an amplifier cell input configured to receive the input signal, one or more amplifiers configured to amplify the received signal to create an amplified signal, and an amplifier cell output. Also part of this embodiment is an input path and an output path. The input path connects to the amplifier cell input to receive the input signal and distributes the input signal to the two or more amplifier cells. The input path includes one or more buffers configured to introduce a delay into the input signal. The output path connects to the amplifier cell outputs of the two or more amplifier cells and is configured to receive the amplified signal. The output path includes one or more inductors that cancel parasitic capacitance from the two or more amplifier cells.

The buffer may be selected from the following group of elements: inverters, EML type buffers with resistor loads, delay stages with delay controlled through e.g. adjustable cap loading or current or supply, or any other device or element configured to provide a signal delay. The combination of the amplifier parasitic capacitance and the inductors in the output path form a transmission line that reduces or distributes the parasitic capacitance from the two or more amplifiers. The capacitor is used as part of the artificial transmission line. The distributed stages means that the capacitor loading is reduced compared to a single lumped stage. This distributed capacitance has therefore a lower impact on the bandwidth (BW). In other designs, an inductor can be placed in series with a load capacitor. This acts to compensate for impact of the capacitor. While it is a common practice to extend the bandwidth with large capacitor loading, that is different from what is occurring with the artificial transmission line LC segments. In this case the lumped cap is divided down by the number of stages. This capacitor is then exploited in the transmission line segments to set the impedance, delay, and bandwidth. The bandwidth of the transmission line segment is much lower than the required bandwidth of the driver.

In one embodiment, the delay introduced by the one or more buffers matches the delay associated with delay in the output path. The distributed driver may further include a biasing cell connected to each amplifier cell, such that the biasing cell distributes a biasing cell capacitance to each amplifier cell so that the one or more inductors can cancel the biasing cell capacitance.

Also disclosed herein is a distributed driver for an optic signal generator comprising a driver input configured to receive an input signal, and an output configured to provide an output signal from the distributed driver. The distributed driver includes a first amplifier cell comprising a first amplifier cell input, one or more amplifiers, and a first amplifier cell output. The first amplifier cell is configured to receive and amplify the input signal to create a first amplified signal on the first amplifier cell output. A second amplifier cell is also part of this embodiment, and it comprises a second amplifier cell input, one or more amplifiers, and a second amplifier cell output. The second amplifier cell is configured to receive and amplify the input signal or a delayed input signal to create a second amplified signal on the second amplifier cell output. An output conductive path connecting the driver output to the first amplifier cell output and the second amplifier cell output, the output conductive path carrying the first amplified signal and the second amplifier signal to the driver output, such that an inductance of the output conductive path reduces or distributes the capacitance associated with the first amplifier cell and the second amplifier cell. An input conductive path connects the driver input to the first amplifier cell input and the second amplifier cell input. The input conductive path carries the input signal to the first amplifier cell and the second amplifier cell such that the input conductive path includes one or more buffer units that match delays associated with the output conductive path. The distributed nature means capacitor loading is lower and has less impact on overall driver bandwidth. The transmission line is composed of the L & C units and sets the impedance and delay of the transmission line segment. The LC bandwidth is set to be much higher than the bandwidth required for the driver.

In one embodiment, the output conductive path includes one or more inductors, and the input conductive path includes one or more buffers. It is contemplated that the distributed driver may be configured as a differential pair. In one configuration, the distributed driver further comprises one or more additional amplifiers cells having a configuration that is the same as the first amplifier cell and the second amplifier cell. The buffer units may be selected from the following type of delay units: inverters, EML type buffers with resistor loads, delay stages with delay controlled through e.g. adjustable cap loading or current or supply, or any other device or element configured to provide a signal delay. In addition, the distributed driver may further comprise a first bias cell connected to the first amplifier cell such that the first bias cell is configured to bias the optic signal generator, and a second bias cell connected to the second amplifier cell, such that the second bias cell is configured to bias the optic signal generator.

Also disclosed is a method for amplifying, with a distributed amplifier, an input signal for driving an optic signal generator. In one configuration, this method comprises receiving the input signal and distributing the input signal to two or more amplifier cells over an input path, and selectively delaying the input signal, as it passes along the input path, with one or more buffers. This method then amplifies the input signal with the two or more amplifier cells to generate amplified output signals. The amplified output signals are from the two or more amplifiers on an output path, the output path having an inductance that reduces the impact of the parasitic capacitance of the two or more amplifier cells by dividing it through distribution, such that the delay introduced by selectively delaying matches delay introduced by the inductance in the output path. Then, presenting the amplified output signal on an output from the distributed amplifier such that the output is connected to the output path.

This exemplary method of operation method may further comprise biasing the optic signal generator with two or more bias cells which are distributed, such that two or more amplifier cells have at least one bias cell. In one embodiment, the buffers may comprise one or more of the following: inverters, EML type buffers with resistor loads, delay stages with delay controlled through e.g. adjustable cap loading or current or supply, or any other device or element configured to provide a signal delay. In one configuration, the method further comprising adding a variable amount of capacitance to at least one of the two or more amplifier cells.

It is also contemplated that a first variable capacitor may be provided in the first amplifier cell and configured to selectively tune the capacitance of the first amplifier cell. Similarly, a second variable capacitor may be provided in the second amplifier cell and configured to selectively tune the capacitance of the second amplifier cell. In addition, it is disclosed herein that a first bias cell may be connected to the first amplifier cell, such that the first bias cell is configured to bias the optic signal generator. A second bias cell may be connected to the second amplifier cell, such that the second bias cell is configured to bias the optic signal generator.

In one exemplary implementation, the gain cell includes at least two stages of amplification, such as two cascaded differential amplifiers. This arrangement is useful to maintain stability of the laser driver because it improves isolation between input and outputs of the gain stages, particularly in silicon technologies which are not as good at isolation as compared to other technologies. This configuration also reduces or eliminates oscillation. The two gain stage cells provide good isolation without wasting voltage output dynamic (that is a critical specification for laser driver), as opposed to a single gain stage with cascoded output. By spreading the driver system (amplifier) across several stages or cells, the isolation is increased, as compared to if each gain cell was a single amplifier. Failure to provide enough isolation between input and output of the gain cell may create instability in the system and lead to oscillations. In addition, by establishing a distributed system, the capacitance is spread between stages, which in addition to the inductors, reduces capacitances and allows the values of the inductors associated with the gain cells to be selected to provide impedance matching to the output load. Stated another way, by spreading the capacitance in the gains cells as shown, the capacitance essentially disappears.

The inductance is in or part of the core of the amplifiers. The inductors combined with the parasitic capacitor form a transmission line over which the signal propagates. The gain cells (with its parasitic capacitors) and inductors appear as gain stages connected by a transmission line.

Other systems, methods, features, and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 3:
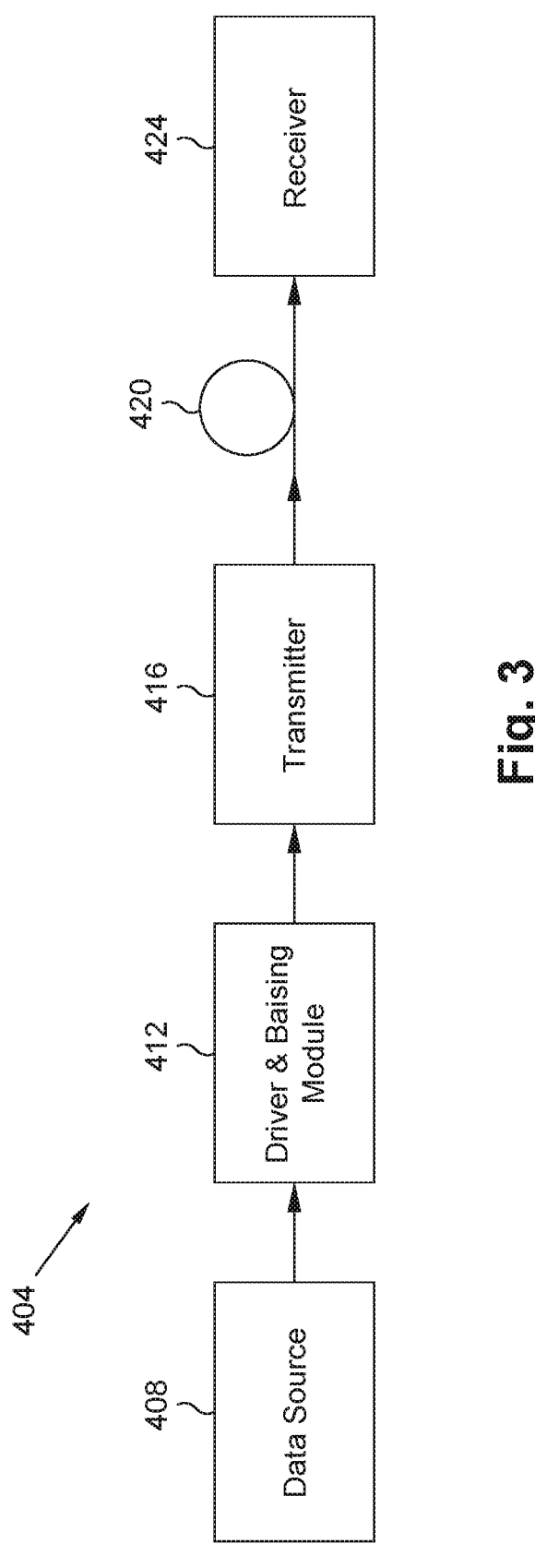
FIG. 3 illustrates an example environment of use of the distributed driver disclosed herein.

FIG. 3 illustrates an example environment of use of the distributed driver disclosed herein. This is but one possible embodiment, and it is contemplated and understood that the innovation disclosed herein may be used in other environments than disclosed below. As shown, an exemplary optic signal transmitter 404 includes a data source 408 that provides data for transmission as an optic signal. The data source 408 may be another system or device, either on chip, or off chip, or a memory. The data source 408 provides data to a driver and biasing module 412. The driver and biasing module 412 prepare the data for transmission as an optic signal and amplifies the signal to a level suitable for transmission by an optic signal generator 416. In this embodiment, the driver and biasing module 412 is configured as a distributed driver as described above with optional distributed biasing.

The output of the driver and biasing module 412 provides the amplified signal (with biasing) to the optic signal generator 416, such as a laser, or any other type device capable of generating an optic signal for transmission over a fiber optic cable or other optic signal carrying medium. Optical signal generators that may be used with the driver disclosed herein are direct modulated lasers (DMLs), EMLs (Electroabsorptive Modulated Lasers), VCSELs (Vertical Cavity Surface Emitting Lasers), LEDs (Light Emitting diodes), PICs (photonic integrated circuits) and other optical modulators. The generated optic signal is provided to a fiber optic cable 420, which carries the optic signal to a remotely located receiver 424.

Figure 4:
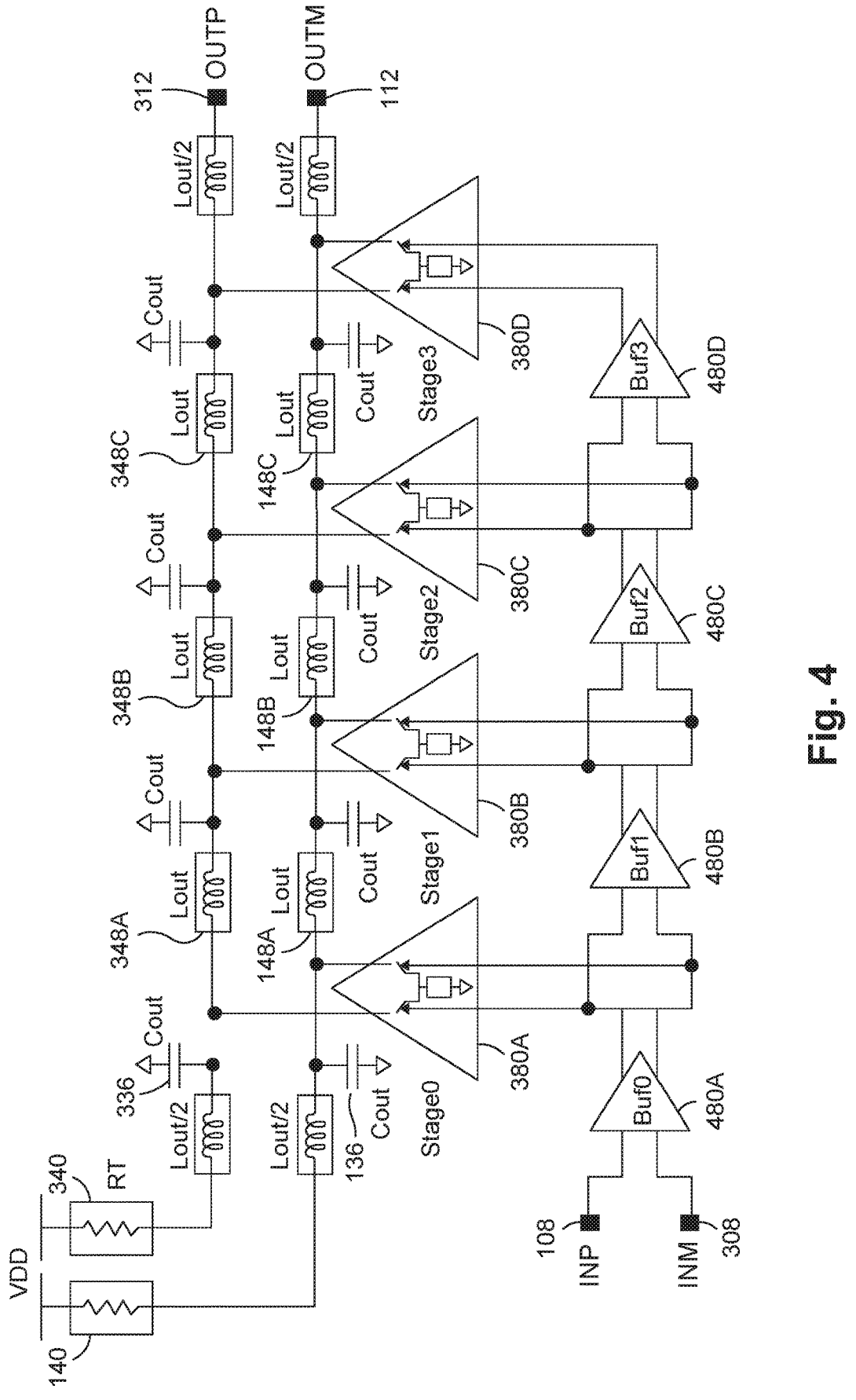
FIG. 4 illustrates an example embodiment of a hybrid distributed driver arranged with buffers in the input line.

FIG. 4 illustrates an example embodiment of a hybrid distributed driver arranged in with buffers in the input line. In relation to FIGS. 1 and 2, similar elements are labeled with identical reference numbers. Elements previously described are not described again. In this embodiment, the distributed amplifiers are configured as a differential pair. A pair of FET device 370, 372 are arranged as shown with a current source 380 or path located below the FET device 370. Operation of this circuit configuration is known in the art and not described herein. More than one differential pair may be provided in each cell 380A. Additional differential pairs 380B, 380C, and 380D are also provided as shown. Each amplifier stage (driver stage) may comprise two or more drivers and each driver may have one or more amplifier therein. The drivers may be single ended or differential. As shown, more than one gain cell, that is shown as circuit blocks, amplify an input signal. In the following description input and output of a circuital block will be described as with single ended or differential, but the same concepts and features can be easily applied to single ended or differential input/outputs.

The input path at the bottom of FIG. 4 comprises one or more buffers 480A, 480B, 480C, 480D. The differential signal provided on input nodes 108, 308 connects to the first buffer 480A. These input nodes 108, 308 may connect to any type of CMOS logic or any other element that provide an input to the system of FIG. 4, such as but not limited to a buffer, a gate, a standard cell, or any other element. The first buffer introduces a delay. However, in this embodiment, there are no termination resistors, which removes the need for impedance matching. This is a major advantage of this new hybrid approach. The traditional input transmission line has been replaced by buffer stages with no impedance requirements. The traditional approach necessitated the use of a buffer 0 which had an output impedance matching the impedance of the input T-line.

The output of the first buffer 480A connects to a stage 0 driver 380A and to a second buffer 480B. The second buffer 480B also introduces a delay in the received signal and provides an output signal to the stage 1 differential pair amplifier 380. The connection pattern continues with the third buffer 480C and the fourth buffer 480D. The output of the fourth buffer 480D connects to the stage 3 differential pair amplifier. It is contemplated that each buffer may have a different delay, or the same delay. The amount or duration of delay may also be referred to as delay strength. Stronger buffers have more delay and are also able to drive more gates. By selecting the delay strength, the amount of delay can also be controlled. The delay may also be programmable through adjustable capacitor loading.

The delay of each buffer is configured to introduce a delay into the received signal to time align the signal such that at the output nodes 112, 312, a time (phase) aligned differential signal is output. The output of stage 380B should time align with the output of stage 380A in combination with inductors 148A, 348A and the parasitic capacitance (Cout). The output nodes 112, 312 may connect to any down stream element, such as a laser, AC coupling capacitors, antenna, transmission line, board traces or any other element or system.

In some embodiments, the first buffer 480A may be optional but it may be beneficial to drive the signal so that a clean signal with adequate transition times is presented to the driver. The delay associated with the input path should match the delay associated with the inductance and capacitance of the output line to have the signals in the input line and output line to have the same phase alignment at each stage of the multi-stage amplifier, taking into account other elements which cause delay. If each amplifier output was not aligned in time, the resulting output signal would have phase misalignment.

It is also contemplated that each buffer 480 may be configured as one or more buffers or other type delay elements. Thus, instead of one buffer 480B, there may be two or more buffers that collectively function as buffer 480B. The other buffers may be configured the same way. Each buffer may also be a different number of buffers or delays as compared to other buffers in the input path. Thus, buffer 480A may comprise one buffer while buffer 480C may comprise more than one buffer or introduce different amounts of delay. The buffers may invert the signal, but the output may be crossed or swapped as shown below in FIG. 5A.

As can be seen in FIG. 4, the output transmission line remains unchanged, but the input transmission line is replaced by buffer stages 480. These buffer stages 380 can be small and low power, while the L & C components of the equivalent input line can be quite large and require careful placement to minimize coupling that can impact their target values. The impedance value of the input transmission line (Rin) also imposes design constraints on the buffer driving into the line and can also lead to reduced input swing on the distributed driver stages.

The delay of the new buffer stages 480 should match the equivalent LC delay of the output transmission line. These buffer stages 480 can be implemented as standard differential CML type stages or even as simple CMOS inverter stages. The delay of these buffers can be adjusted through standard known approaches such as programmable capacitor loading, adjustable supply voltage, programmable bias current, or any other method or configuration.

The buffers 480 may be implemented through simple CMOS inverters in a fine-line CMOS process or using any other known or future develop process. The inverter strength/delay was chosen to meet the nominal delay of the output line. The inverter delay varies over changes to the process, temperature, and supply voltage. These variations are not significant enough to impact the performance of the driver. No delay tuning was therefore required on these inverter stages.

Figures 5A, 5B, 5C:
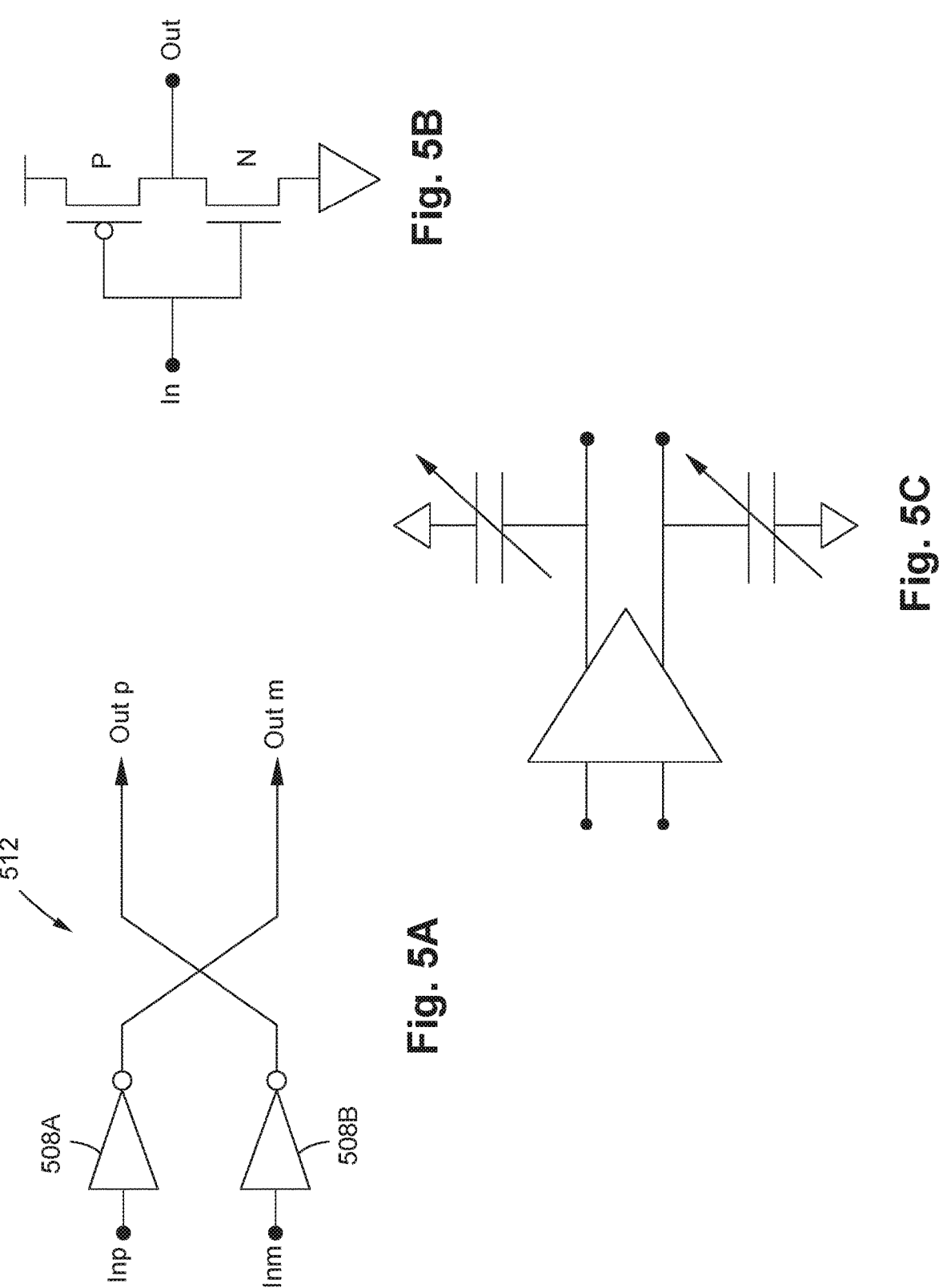
FIG. 5A illustrates one example embodiment of a buffer comprising two single-ended CMOS inverter type cells to create a differential buffer.
FIG. 5B illustrates an example embodiment of one of the single-ended cell components of the buffer configured as a transmit cell formed from a differential pair.
FIG. 5C illustrates an alternative embodiment of the buffer having variable capacitors connected between each output path and ground. The cell may be a differential buffer comprising the inverter cells or could be an analog differential EML type buffer with resistor loads.

Numerous different configurations are possible for the buffers 408A-408D shown in FIG. 4. FIG. 5A illustrates one example embodiment of a buffer. This buffer includes two inverter cells 508A, 508B which have outputs that change positions or cross over 512 to counter the signal inverting effects of the inverters. This configuration (and numerous other types of buffers) is typically part of a library of known elements and the size. As such the amount of delay may be adjusted or controlled based on the size and other characteristics of the inverters 508A, 508B. The buffer could also be configured as a transmitter cell (analog type cell) with differential inputs, with a programmable capacitor load to tune or control the amount of delay.

FIG. 5B illustrates an example embodiment of a CMOS inverter. This embodiment comprises a transmit cell formed from a differential pair configured with series connected FETs. The supply voltage may be adjusted to control the amount of delay developed by the buffer.

FIG. 5C illustrates an alternative embodiment of a buffer having variable capacitors connected between each output path and ground. By adjusting the capacitance, the delay may be adjusted.

Figure 5E:
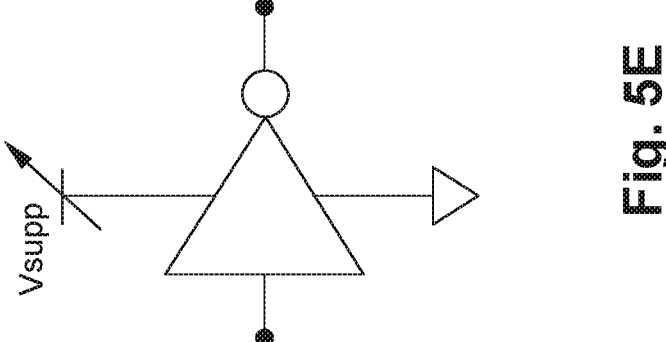
FIG. 5E illustrates an alternative embodiment of a buffer.
Figure 5D:
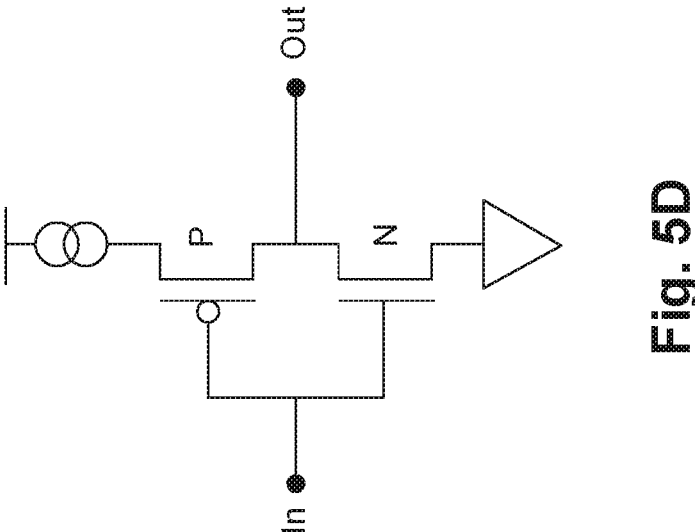
FIG. 5D illustrates an example embodiment of a buffer configured similarly to FIG. 5B, but with an adjustable current source at the top of the inverter circuit.

FIG. 5D illustrates an example embodiment of a buffer configured similarly to FIG. 5B, but with a current source at the top of the inverter circuit. The opposing terminal of the current source connects to an analog bias signal, and as the bias signal is adjusted the amount of delay provided by the circuit is adjusted. The adjustable current source may also be placed on the bottom and used to control the delay of the cell by varying the current.

FIG. 5E illustrates an alternative embodiment of a buffer. In this embodiment, the inverter receives a supply voltage from a variable supply voltage which control the delay. The inverter also connects to ground as shown.

Figure 1:
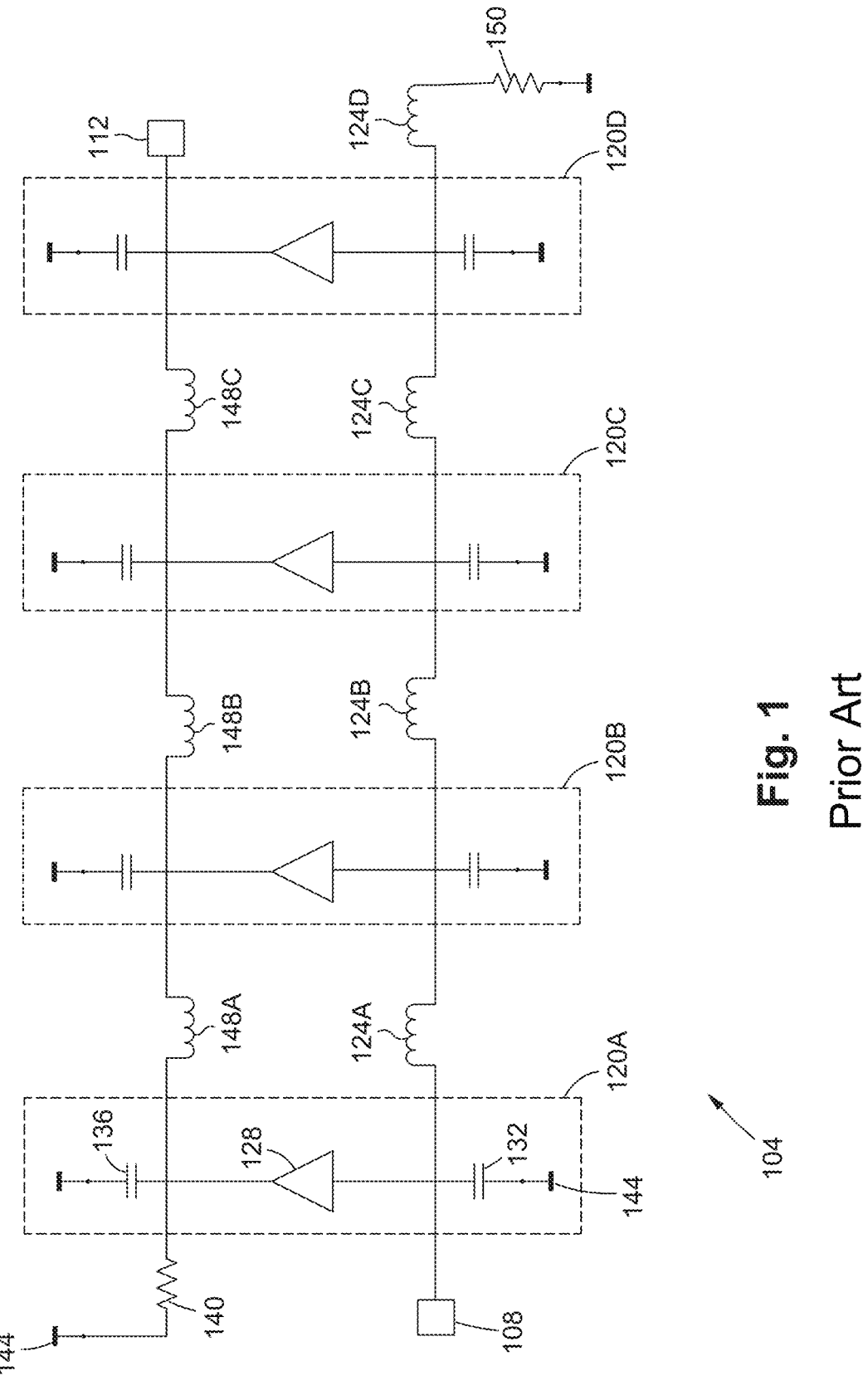
FIG. 1 is a block diagram illustrating an example embodiment of a prior art distributed driver.
Figure 2:
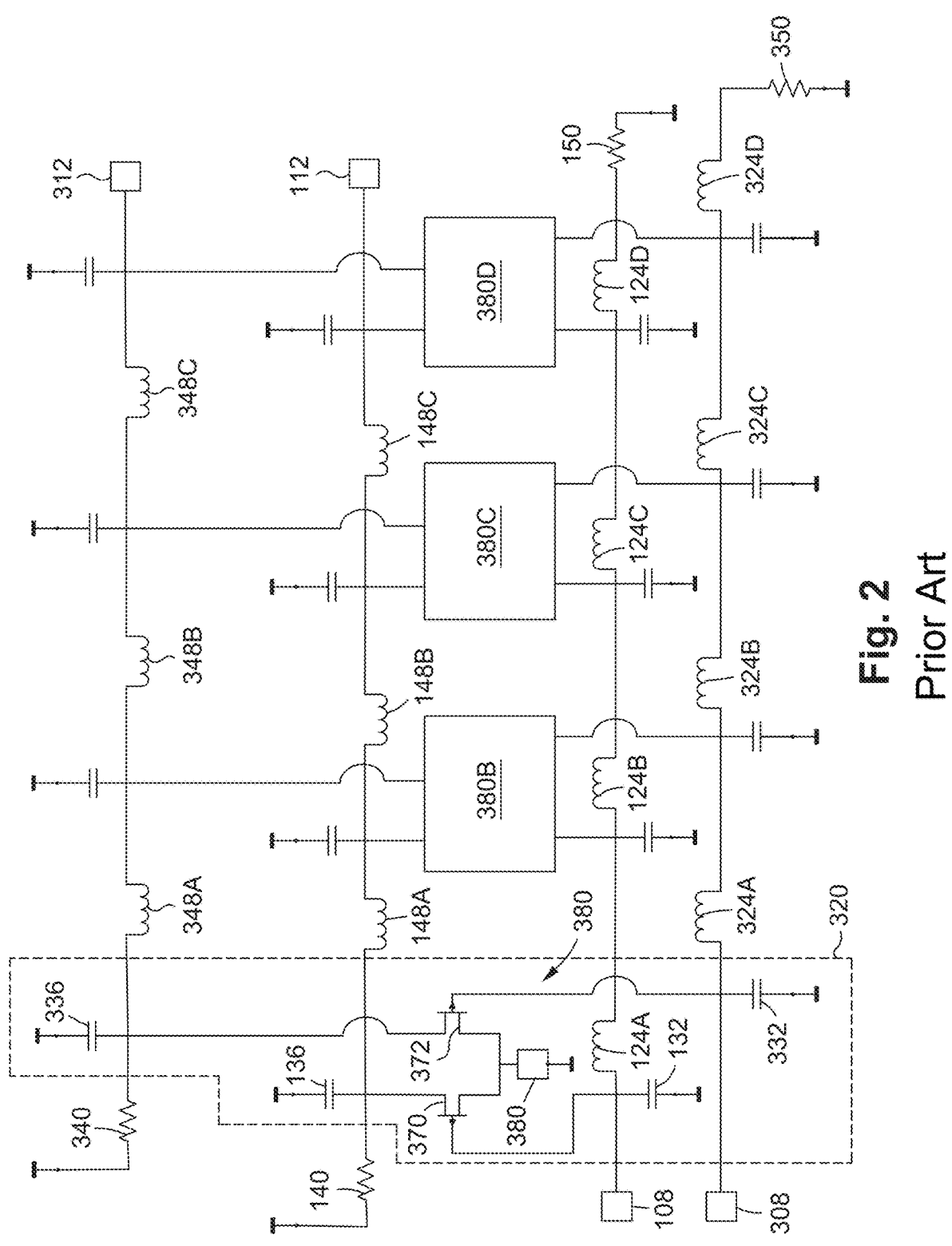
FIG. 2 illustrates an example embodiment of a prior art distributed driver arranged in a differential pair configuration.
Figure 6A:
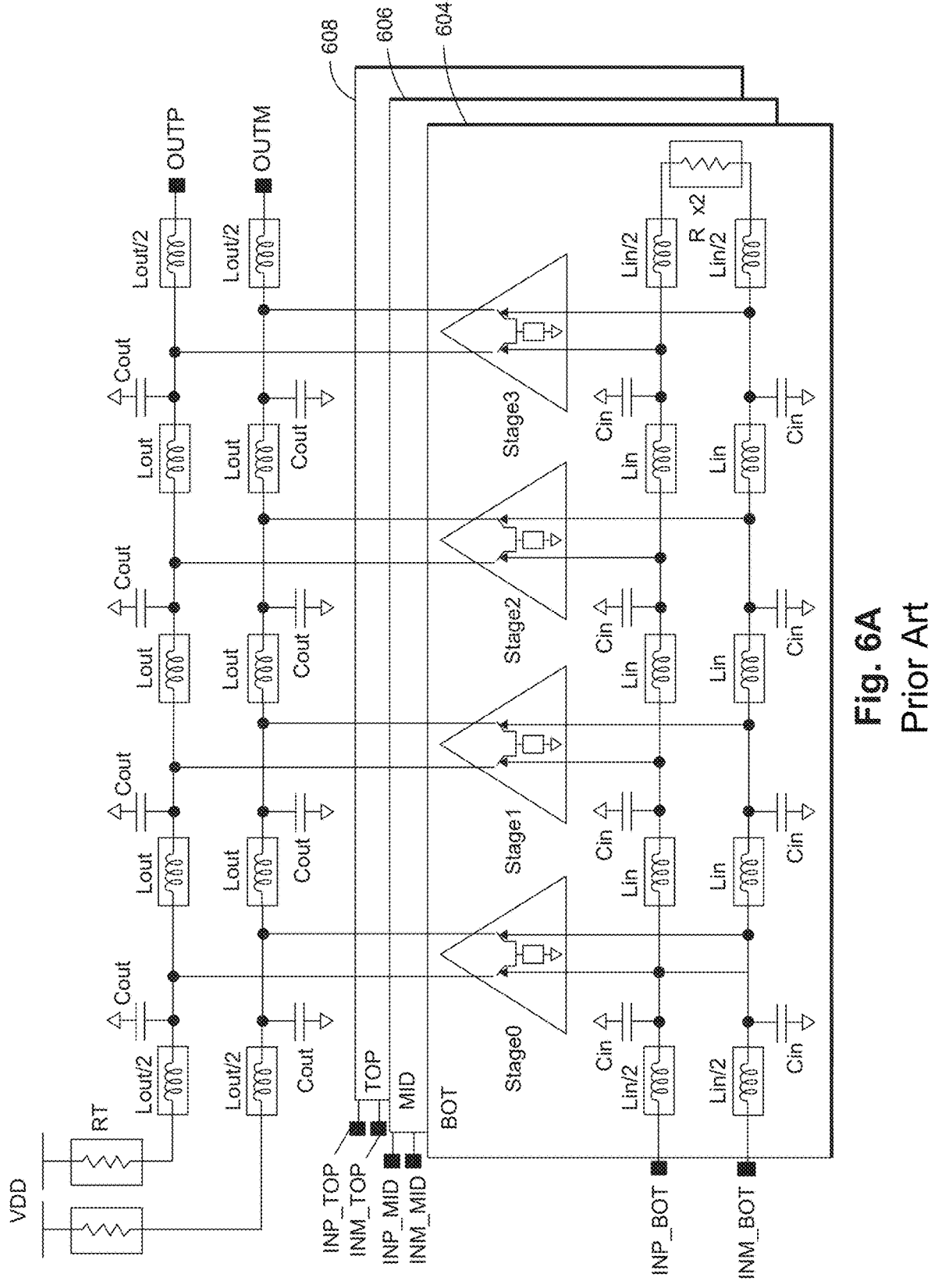
FIG. 6A illustrates an example embodiment of a prior art PAM4 system.

As a benefit to the embodiments disclosed herein, the buffers in the input transmission line reduce the space consumed as compared to the prior art embodiment of FIG. 2. FIG. 6A illustrates an example embodiment of prior art PAM4 system. In the case of a PAM4 transmitter, there are three different instances 604, 606, 608 of the input line and drivers as shown in FIG. 1. Thus, for a PAM4 system, the power and space consumed by the input line and drivers 604, 606, 608 is significant.

Figure 6B:
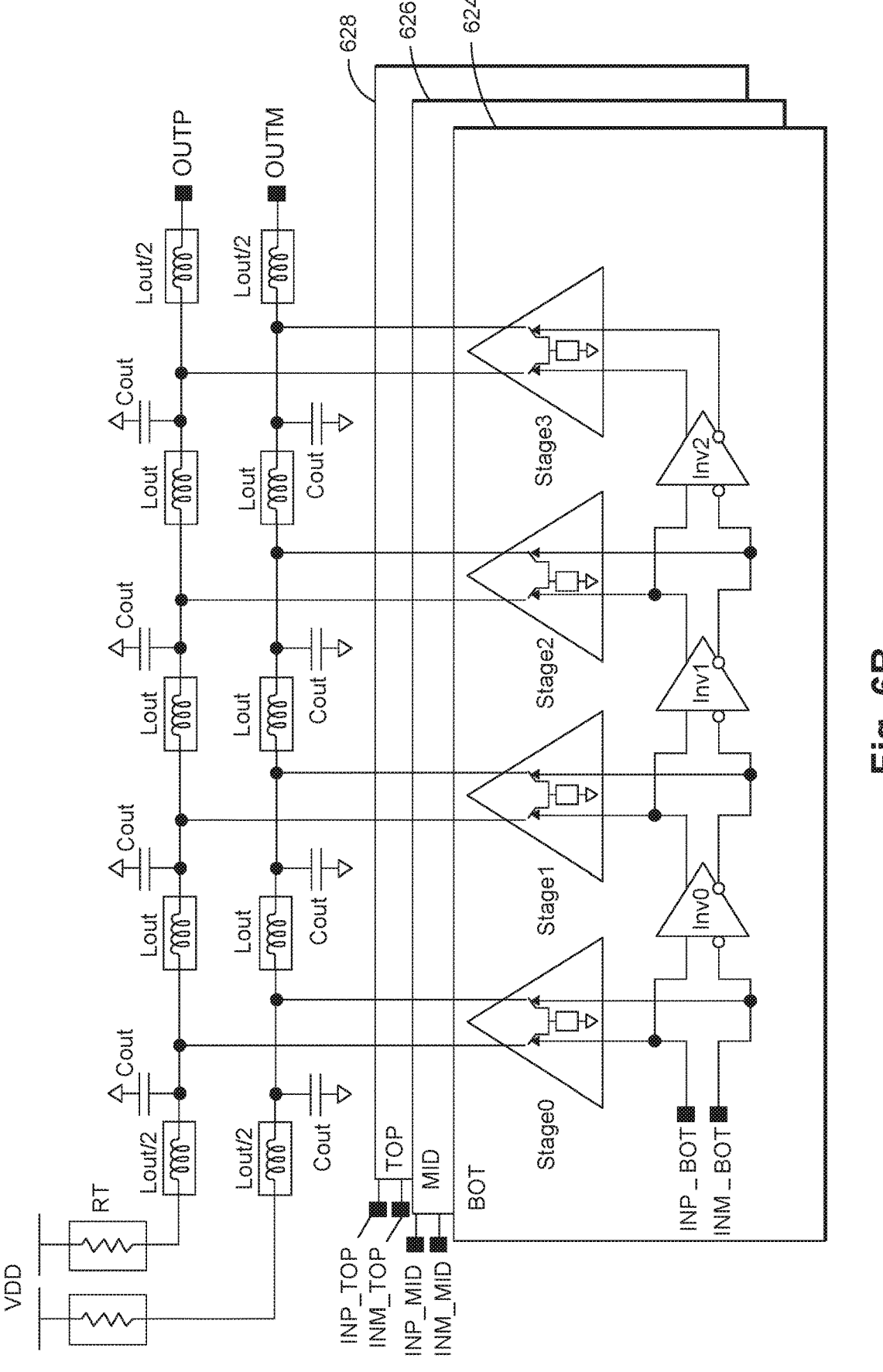
FIG. 6B illustrates a PAM4 system with the input line and driver configuration according to the innovation disclosed herein.

In contrast, FIG. 6B illustrates a PAM4 system with the input line and driver configuration according to the innovation disclosed herein. As consistent with a PAM4 system, there are three instances 624, 626, 628 on the input line having buffers and drivers. With this configuration, the space reduction is approximately 50% as compared to the embodiment of FIG. 6A due to the size of the inductors and capacitors that are required to provide the delay and impedance matching required in the input line. In other designs and circuits, the realized space reduction can vary significantly depending on the fabrication process, the design implementation such as flip-chip, the speed, and the impedance requirements.

In addition, power consumption can be reduced because fewer components are used, and in the prior art design, a higher current and voltage swing is required to drive the input transmission line, while with the buffer configured input path, a lower input current and voltage may be utilized. Finally, the new design does not have termination resistors at the end of the input line, and the elimination of these resistors further simplifies the design because an input buffer would need to be designed with an output impedance matching the input transmission line impedance. These input transmission lines can be replaced by simplified low power consumption delay stages such as CMOS inverters.

U.S. Pat. No. 10,263,573 (application Ser. No. 15/690, 674) issued on Apr. 16, 2019, filed on Aug. 30, 2017, entitled Driver With Distributed Architecture is incorporated by reference, in its entirety, herein.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A distributed driver for an optic signal generator comprising:

two or more amplifier cells having:
an amplifier cell input configured to receive a differential input signal;
one or more differential amplifiers configured to amplify the received signal to create an amplified signal;
an amplifier cell output configured to output a differential output signal;
an input path connected to the amplifier cell input to receive the differential input signal and distribute the differential input signal to the two or more amplifier cells, the input path including one or more adjustable differential buffers configured to introduce a delay into the input signal, wherein the adjustable differential buffers include an adjustable current source, wherein the current source is: located at a top of an inverter circuit and an opposing terminal of the current source connects to an analog bias signal, and as the bias signal is adjusted the amount of delay provided by the circuit is adjusted, or the adjustable current source is placed on a bottom of the inverter circuit and used to control the delay of the cell by varying the current;

an output path connected to the amplifier cell outputs of the two or more amplifier cells, the output path configured to receive the amplified signal, the output path including one or more inductors that cancel parasitic capacitance from the two or more amplifier cells.

2. The distributed driver of claim 1, wherein others of the one or more adjustable differential buffers are selected from the following group of elements: inverters, EML type buffers with resistor loads, delay stages with delay controlled through adjustable capacitor loading or adjustable current or supply voltage.

3. The distributed driver of claim 1, wherein the combination of the amplifier parasitic capacitance and the inductors in the output path form a transmission line that integrates the parasitic capacitance loading into a transmission line's capacitance component of an LC segment.

4. The distributed driver of claim 1, wherein the delay introduced by the one or more buffers matches the delay associated with delay in the output path.

5. The distributed driver of claim 1, wherein the distributed driver is in a PAM4 system.

6. A distributed driver for an optic signal generator comprising:

a driver input configured to receive an input signal;
an output configured to provide an output signal from the distributed driver;
a first amplifier cell comprising a first amplifier cell input, one or more amplifiers, and a first amplifier cell output, the first amplifier cell configured to receive and amplify the input signal to create a first amplified signal on the first amplifier cell output;
a second amplifier cell comprising a second amplifier cell input, one or more amplifiers, and a second amplifier cell output, the second amplifier cell configured to receive and amplify the input signal or a delayed input signal to create a second amplified signal on the second amplifier cell output;
an output conductive path connecting the driver output to the first amplifier cell output and the second amplifier cell output, the output conductive path carrying the first amplified signal and the second amplifier signal to the driver output, such that an inductance of the output conductive path combines with capacitance loading from the first amplifier cell and the second amplifier cell to form a transmission line LC segment; and
an input conductive path connecting the driver input to the first amplifier cell input and the second amplifier cell input, the input conductive path carrying the input signal to the first amplifier cell and the second amplifier cell such that the input conductive path includes one or more adjustable differential delay units that match delays associated with the output conductive path, wherein the adjustable differential delay units include an adjustable current source, wherein the current source is: located at a top of an inverter circuit and an opposing terminal of the current source connects to an analog bias signal, and as the bias signal is adjusted the amount of delay provided by the circuit is adjusted, or the adjustable current source is placed on a bottom of the inverter circuit and used to control the delay of the cell by varying the current.

7. The distributed driver of claim 6, wherein the output conductive path includes one or more inductors, and the input conductive path includes one or more buffers.

8. The distributed driver of claim 6, wherein the distributed driver is configured as a differential pair.

9. The distributed driver of claim 6, further comprising one or more additional amplifiers cells having a configuration that is the same as the first amplifier cell and the second amplifier cell.

10. The distributed driver of claim 6, wherein others of the one or more adjustable delay units are selected from the following type of delay units: inverters, EML type buffers with resistor loads, delay stages with delay controlled through an adjustable capacitor, loading, current, or supply.

11. The distributed driver of claim 6, wherein the distributed driver is part of a PAM4 system.

12. A method for amplifying, with a distributed amplifier, an input signal for driving an optic signal generator, the method comprising:

receiving the input signal;

distributing the input signal to two or more amplifier cells over an input path, and selectively delaying the input signal, as it passes along the input path, with two or more adjustable differential buffers to match delays associated with the output conductive path, wherein the adjustable differential buffers include an adjustable current source, wherein the current source is: located at a top of an inverter circuit and an opposing terminal of the current source connects to an analog bias signal, and as the bias signal is adjusted the amount of delay provided by the circuit is adjusted, or the adjustable current source is placed on a bottom of the inverter circuit and used to control the delay of the cell by varying the current;

amplifying the input signal with the two or more amplifier cells to generate amplified output signals;

combining the amplified output signals from the two or more amplifiers on an output path, the output path having an inductance that cancels a parasitic capacitance of the two or more amplifier cells, such that the delay introduced by selectively delaying matches delay introduced by the inductance in the output path; and presenting the amplified output signal on an output from the distributed amplifier, the output connected to the output path.

13. The method of claim 12, further comprising biasing the optic signal generator.

14. The method of claim 12, wherein one or more of the buffers comprise a transmit cell formed from a differential pair.

15. The method of claim 12, wherein others of the adjustable differential buffers comprises one or more inverters.

16. The method of claim 12, wherein combining the amplified output signals from the two or more amplifiers on an output path results in a phase align signal output signal due to buffer delay in the input path being matched to delays associated with the output path.

17. The method of claim 12, further comprising adding a variable amount of capacitance to at least one of the two or more amplifier cells.

* * * * *